United States Patent [19]

Van De Steeg

[11] Patent Number: 4,849,814

[45] Date of Patent: Jul. 18, 1989

[54] CHARGE-COUPLED DEVICE HAVING OVEREXPOSURE CONTROL

[75] Inventor: Martinus J. H. Van De Steeg, Eindhoven, Netherlands

[73] Assignee: U.S. Philips Corp., New York, N.Y.

[21] Appl. No.: 147,850

[22] Filed: Jan. 25, 1988

[30] Foreign Application Priority Data

Feb. 6, 1987 [NL] Netherlands .......................... 8700282

[51] Int. Cl.$^4$ ............................................... H04N 3/14
[52] U.S. Cl. ............................ 358/213.31; 358/213.26
[58] Field of Search ..................... 358/213.31, 213.26, 358/213.19, 909; 357/24 LR

[56] References Cited

U.S. PATENT DOCUMENTS 4,663,669  5/1987  Kinoshita et al. .............. 358/213.26
4,672,455  6/1987  Miyatake ........................ 358/213.31
4,688,098  8/1987  Kon et al. ....................... 358/213.31

Primary Examiner—Jin F. Ng
Assistant Examiner—Stephen Brinich
Attorney, Agent, or Firm—Steven R. Biren

[57] ABSTRACT

A charge-coupled image sensor arrangement has an overexposure adjustment feature whereby the excess of generated electrons is drained in vertical direction to the substrate. In order to adjust the maximum acceptable extent of overexposure, an additional low voltage can be applied to the blocking gates. As a result, it is possible to adjust the maximum overexposure without the maximum white level being variable. Due to the fact that the blocking voltage is a d.c. voltage, the dissipation substantially does not increase.

5 Claims, 2 Drawing Sheets

CHARGE-COUPLED DEVICE HAVING OVEREXPOSURE CONTROL

BACKGROUND OF THE INVENTION

The invention relates to a charge-coupled device for converting electromagnetic radiation into discrete electrical charge packets and transporting these charge packets for reading them out. This device includes a semiconductor body having at least three successive layers from a surface in a direction transverse to the surface: a first layer of a first conductivity type, which constitutes the charge transport channel of the charge-coupled device; an adjoining second layer of the second conductivity type for forming a potential barrier, over which excess charge carriers generated in the case of local overexposure can flow in a direction transverse to the surface; and an adjoining third layer of the first conductivity type for draining excess charge carriers. The surface is provided with a system of electrodes which are connected to means for supplying clock voltages varying between active and blocking levels, with potential wells and potential barriers, respectively, being induced in the subjacent transport channel. The invention further relates to a camera provided with such a charge-coupled device.

Such a device is generally known *inter alia* from the article "A Frame-Transfer CCD Colour Imager with Vertical Anti-Blooming" by M. J. H. v.d. Steeg, *et al*, published in I.E.E.E. Transactions on Electron Devices, Vol. ED-32, No. 8, Aug. 1985, p. 1430-1438.

A charge-coupled device can form together with a large number of similar devices a bidimensional image sensor for use in, for example, a camera. In such sensors, it is common practice to take measures which prevent, in the case of local overexposure, generated charge carriers from spreading over the sensor beyond the overexposed area (pixel) itself. These measures are often designated in literature by the term "anti-blooming". In the best known method of "anti-blooming", so-called overflow barriers and drain zones, by means of which the excess charge carriers can be drained, are provided between the columns of the bidimensional pixel pattern at the surface of the semi-conductor body. Since, due to this anti-blooming method, the resolution and the sensitivity are reduced, the less conventional vertical anti-blooming (VAB) has also been suggested, inter alia in the afore-mentioned publication. This publication describes a sensor having a vertical npn configuration, in which the upper n-type layer constitutes the buried channel of the charge-coupled device, the p-type layer constitutes the overflow barrier for excess charge carriers and the lower n-type layer constitutes the drain of the excess charge carriers. The intermediate layer, here the p-type layer, is preferably provided below the electrode below which the charge is collected with a part of reduced thickness or even with an opening, through which the lower n-type layer adjoins the upper n-type layer. In such a configuration, "blooming" due to overexposure can effectively be avoided without or at least substantially without any detrimental effect on the resolution and/or the sensitivity.

If in this device the extent of overexposure to be handled should be increased, i.e. the extent of overexposure with which all the excess charge carriers can still be drained, it is most obvious to reduce the overflow barrier between the charge transport channel and the drain layer. This may be effected by increasing the voltage at the lower n-type layer (the substrate) and/or by increasing the voltage externally applied to the p-type layer. The increase of the substrate voltage has the disadvantage that a higher maximum supply voltage may be required. However, a more essential disadvantage is that the reduction of the overflow potential barrier leads to a decrease of the maximum charge packet, as will be explained more fully in the accompanying description of the Figures. The decrease of the maximum charge packet to be handled per pixel in general leads to a reduction of the signal-to-noise ratio, which in turn results in a deterioration of the picture quality during display.

Another method of increasing the maximum overexposure to be handled could consist in that the blocking voltage—in an n-channel device—is reduced and hence the potential barrier below the relevant electrodes is increased. If the overflow potential barrier to the substrate is then kept constant, the overexposure can be increased and hence the potential level of the charge packet can also be increased without charge carriers flowing to adjacent pixels, due to the higher potential barrier below the blocking electrodes. In practice, this enlargement of the voltage sweep of the clock voltage is not possible or desirable because the dissipation would become too high.

SUMMARY OF THE INVENTION

The invention has for an object to provide a charge-coupled device with vertical anti-blooming, in which the size of a maximum charge packet (white level) is practically independent of the adjustment of the device with respect to the maximum overexposure to be handled.

The charge-coupled device of the kind described above is characterized according to the invention in that during the conversion of the electromagnetic radiation the blocking level differs from the blocking level during the transport of the charge packets in such a manner that during the conversion of the electromagnetic radiation the difference between the active level and the blocking level is greater than during the transport of the charge packets.

The invention is based *inter alia* on the recognition of the fact that, because the supply of charge carriers to a charge packet during the charge transport is considerably smaller than during the conversion of the image (integration period), the requirements imposed on the height of the potential barrier between the pixels need be considerably less stringent during the charge transport than during the integration period. When the potential barrier below the blocking electrodes is increased, the extent of maximum overexposure to be handled can be adjusted according to desire with unchanged overflow barrier. Due to the fact that during the transport this barrier may be reduced again, a usual clock voltage with a lower sweep is sufficient during the transport. As a result, the dissipation occurring mainly during the transport can be kept at a usual and acceptably low level.

BRIEF DESCRIPTION OF THE DRAWINGS

The invention will be described more fully with reference to an embodiment and the accompanying diagrammatic drawing, in which.

Figure 1:
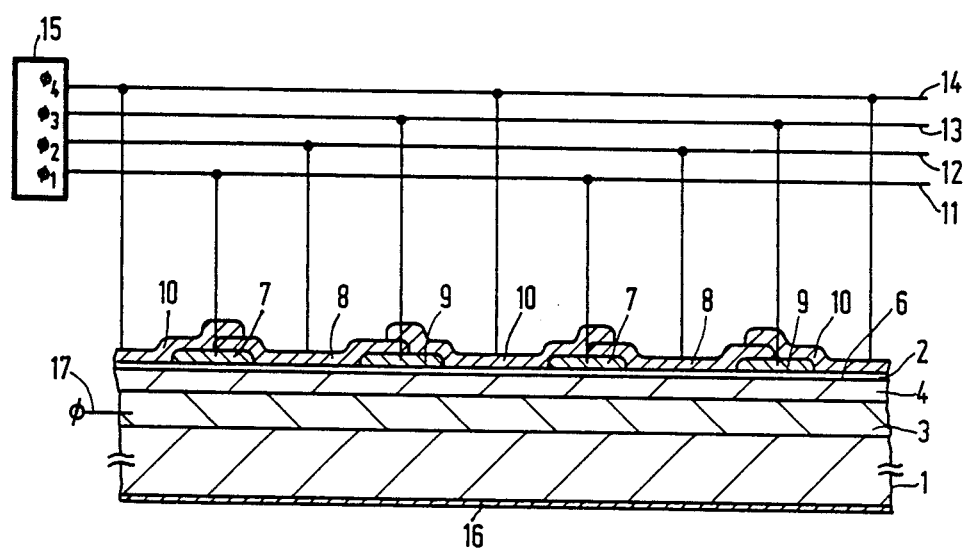
FIG. 1 is a sectional view of a charge-coupled device according to the invention.

It should be noted that the drawing is schematic and not to scale. Semiconductor zones of the same conductivity type are generally cross-hatched in the same direction.

DESCRIPTION OF THE PREFERRED EMBODIMENTS

The device shown in FIG. 1 is, by way of example, of the n-channel type, but may also be of the p-channel type. The device comprises an n-type silicon substrate 1, which is provided at the surface with a p-type layer 3. By means of implantation of a suitable impurity, the n-type zone 4 constituting the buried channel of the charge-coupled device is provided in the p-type zone 3. The zone 4 is laterally bounded by a shallow p-type surface zone 5, which has a higher doping than the p-type zone 3 and which serves to prevent the formation of parasitic n-type channels at the surface 2 beside the zone 4. The surface 2 is covered with a thin dielectric layer 6 of silicon oxide and/or silicon nitride having a thickness of, for example, about 100 nm. A system of clock electrodes 7-10 is provided on the layer 6 in three successive layers of polycrystalline silicon, which are mutually insulated by an oxide layer not shown in the drawing. By way of example, the drawing shows a 4-phase device comprising four clock lines 11-14 for applying the clock voltages $\phi_1$, $\phi_2$, $\phi_3$ and $\phi_4$. The electrodes 7 (poly I) are connected to the clock line 11 ($\phi_1$), while the electrodes 8 (poly II) are connected to the clock line 12 ($\phi_2$), the electrodes 9 (poly I) are connected to the clock line 13 ($\phi_3$) and the electrodes 10 (poly III) are connected to the clock line 14 ($\phi_4$). As is indicated in the aforementioned publication, the electrodes can be shaped so that light windows are left between the electrodes, which are not covered by electrode material, as a result of which blue light can reach the semiconductor body without being absorbed by polysilicon. The clock voltages $\phi_1$-$\phi_4$ are supplied by the clock voltage source 15 shown only diagrammatically. The n-type substrate 1 is provided with an electrical connection, for example in the form of a contact 16 on the lower side of the substrate. However, it will be appreciated without further explanation that the substrate contact may also be provided in known manner on the upper side of the semiconductor body. The p-type barrier layer 3 is provided with a connection 17 shown only diagrammatically in FIG. 1.

Figure 2:
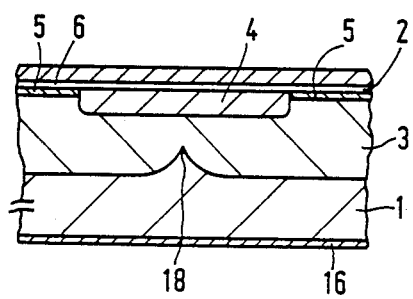
FIG. 2 is a sectional view of this device transverse to the charge transport direction.

The p-type layer 3 may be provided below the channel 4 or at least below the integration areas in the channel 4 with a reduced-width portion 18, as shown in FIG. 2. This reduced-width portion may have such a depth that an n-type channel is left between the n-type channel 4 and the substrate 1, this n-type channel being fully depleted under normal operating conditions so that short-circuit between the substrate and the channel 4 is avoided. Due to this reduced-width portion, it is possible to freely choose the thickness of the zone 3 with desired anti-blooming properties via the reduced-width portion 18.

For the method of manufacturing the device described here, reference may be made to the aforementioned publication. In a specific embodiment, the starting material is an n-type silicon substrate 1 doped with $(3-4.5) 10^{14}$ phosphorus atoms per cm$^3$. The p-type layer 3 with the reduced-width portion 18 may be obtained, as described in this publication, in that two p-type zones (pockets) are implanted and diffused into the semiconductor body at a relative distance from the surface 2, overlap between the zones being obtained due to lateral diffusion and the zones constituting the common p-type region 3 with the reduced-width portion 18. The distance between the implanted zones was about 3 $\mu$m and the diffusion length was about 3 $\mu$m. The surface concentration of the inplanted zones was about $5.6.10^{15}$ boron atoms per cm$^3$. The width of the n-channels 4 was about 5 $\mu$m with a depth of about 0.9 $\mu$m and a surface concentration of $2.10^{16}$ atoms per cm$^3$.

Figure 4:
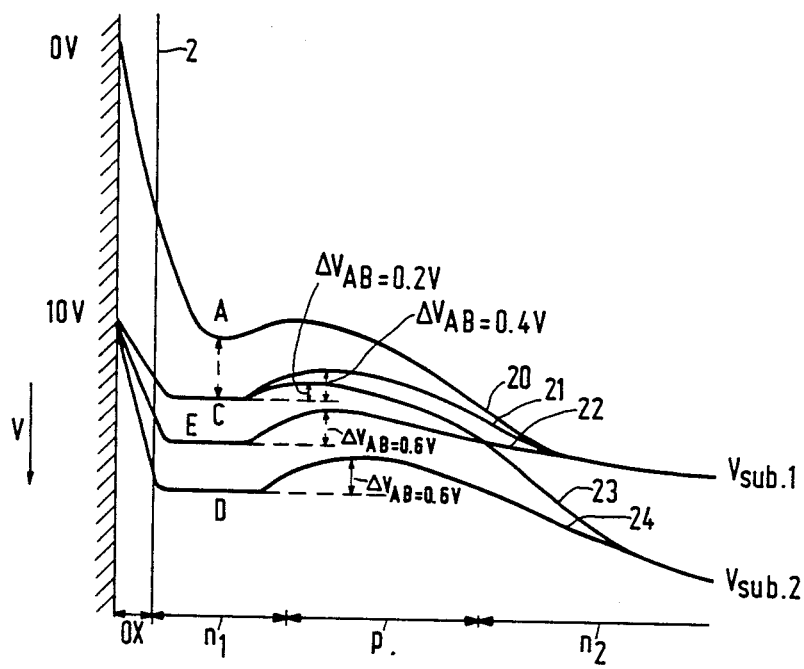
FIGS. 4 and 5 show potential distributions occurring during operation in a conventional device and in a device according to the invention, respectively.

In order to explain the invention, first the potential profile for a conventional CCD image sensor arrangement with vertical anti-blooming is described with reference to FIG. 4. In this Figure, the potential V is plotted in vertical direction (downwards), while the distance in the semiconductor body 1 from the surface 2 is plotted on the abscissa. The shaded area on the left-hand side represents a clock electrode. The region indicated by "ox" corresponds to the oxide layer 6. The regions indicated successively by $n_1$, p and $n_2$ correspond to the n-channel 4, the p-type layer 3 and the n-substrate 1, respectively. The curves 20, 21 and 22 indicate potential profiles in the case in which a substrate voltage $V_{sub1}$, for example +16 V, is applied to the substrate 1. The curve 20 indicates the potential below the blocking electrode, i.e. an electrode to which a low voltage (for example 0 V) is applied, as a result of which a potential barrier is induced below this electrode, which insulates two adjacent pixels from each other. The voltage at the electrode can be chosen so that the potential in the n-layer is slightly higher below this electrode (point A) than in the p-layer 3 and the electrons "see" a potential barrier to the p-type layer. As a result, electrons generated here will preferably flow into one of the adjacent pixels and will not be drained via the substrate 1. The curve 21 represents the potential distribution below an integrating gate, to which a positive voltage of, for example, +10 V is applied. Below this gate, a charge packet consisting of electrons is stored, as a result of which the region below the electrodes becomes (partially) electrically neutral. In the Figure, this electrically neutral region is represented by the horizontal line in the potential distribution. The voltages which are applied are chosen so that with the maximum permissible overexposure the difference between the potential level A below the blocking gate and the potential level below the integrating gate, i.e. the level C, does not exceed a predetermined value. A specific value for the difference A-C is, for example, 1 V. At this value, it is substantially eliminated that, due to thermal excitation, electrons diffuse over the potential barrier A from one pixel to an adjacent pixel. It has been found that in specific embodiments at the random value A-C $\approx$ 1 V and at a substrate voltage of 16 V the voltage difference $\Delta V_{AB}$ between the electrically neutral region and the barrier in the p-type layer 3 is about 0.4 V, which corresponded to an exposure of about 100 times. If the overexposure should suddenly be stopped or, which amounts to the same thing, if the charge packet is transported to an adjacent storage site on which no radiation is incident, the diffusion of excess charge carriers over the barrier $\Delta V_{AB}$ is not stopped, but is continued until the curve 22 is reached, where $\Delta V_{AB} \approx 0.6$ V. In the case in which, with unchanged A–C=1 V a higher overexposure has to be tolerated, for example an overexposure of 10,000 times, $\Delta V_{AB}$ has to be reduced from 0.4 V to about 0.3 V. With the use of the same two-level clock voltages, this can be achieved in that the voltages applied to the substrate 1 and/or the voltage applied to the p-type layer 3 are varied. FIG. 4 shows by way of example the situation occurring when $\Delta V_{AB}$ is adjusted by means of the substrate voltage. The voltage is adjusted, for example, to ±20 V (Vsub.2). The curve 23 indicates the situation occurring with an exposure of, for example, 1000 times. The barrier $\Delta V_{AB}$ is reduced to about 0.2 V with a voltage difference A-C of 1 V. This value $\Delta V_{AB} \approx 0.2$ V is sufficiently low to drain the generated photocurrent with the locally very high luminous intensity to the substrate 1. If now the charge packet is transferred to an adjacent non-exposed storage site, the charge transport to the substrate is continued until again $\Delta V_{AB} \approx 0.6$ V is reached. This situation is shown by the curve 24. When the rest level $\Delta V_{AB}$ has been reached, the potential level D of the neutral region in the charge packet formed is found to be reduced considerably, i.e. about 1 V with respect to the level E, which was the rest level at the substrate voltage Vsub1=16 V. Since the level D at this substrate voltage corresponds to the maximum charge packet that can be stored below an integrating gate, the result of an increase of the permissible overexposure is a disproportionately strong reduction of the maximum charge packet. It should be noted that this reduction is particularly strong, i.e. about 1 V with respect to the reduction aimed at of $\Delta V_{AB}$, i.e. about 0.2 V. This is due to the fact that by an increase of the substrate voltage the height of the barrier in the p-type layer 3 is reduced, it is true, but at the same time the potential in the n-type layer 4 is reduced. The difference $\Delta V_{AB}$ decreases comparatively slowly with an increasing substrate voltage. As a result, a substantial reduction of the potential level in the layers 3 and 4 is required before the desired small reduction of the anti-blooming barrier is attained.

A similar situation would occur if the substrate voltage were kept constant and if a more positive voltage were applied to the p-type layer 3 through the connection 3.

The disadvantage described here could be obviated by the use of clock voltages with a larger sweep, varying, for example between 0 V and 12 V. Such an enlargement of the clock sweep would result in a considerable increase of the dissipation, however.

Figure 3:
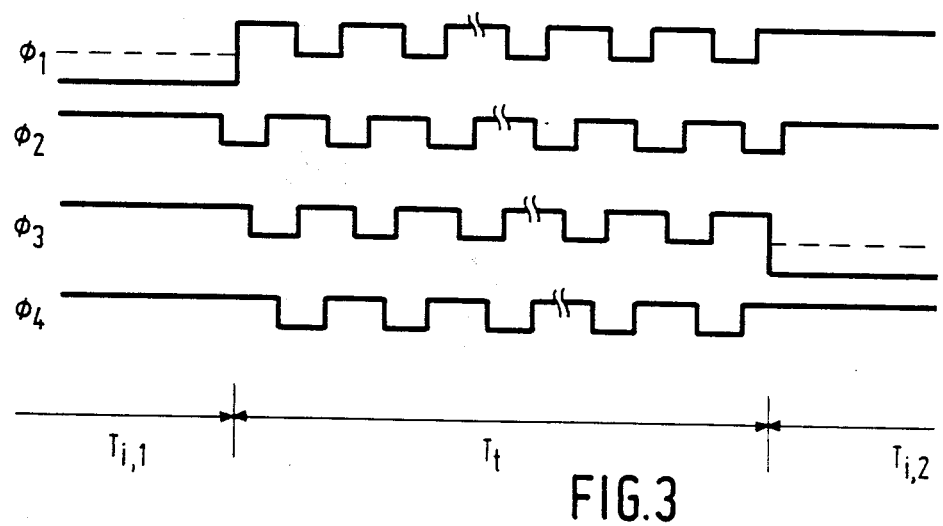
FIG. 3 shows a clock diagram of the clock voltages applied to this device as a function of the time t.
Figure 5:
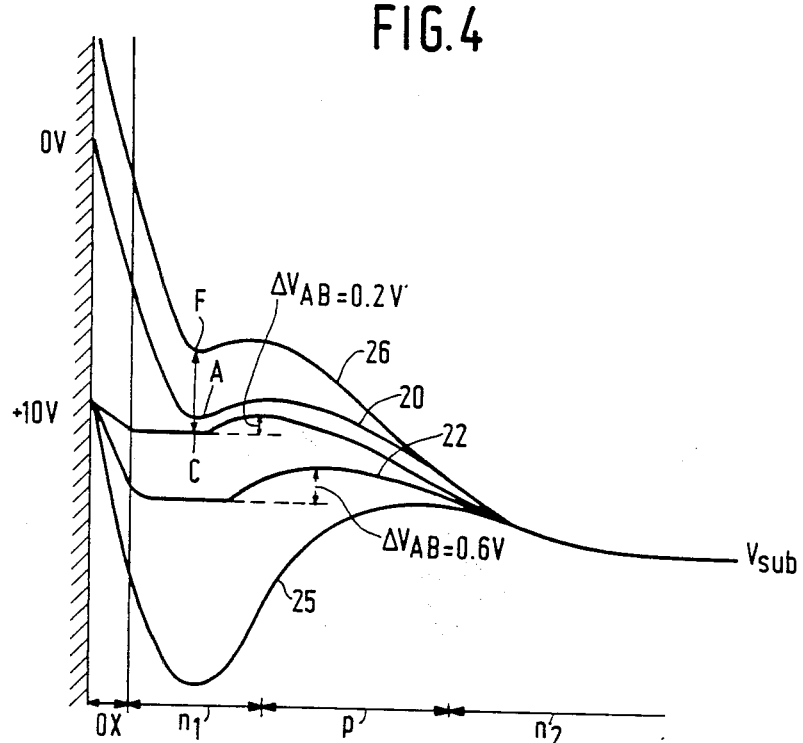

According to the invention, the clock electrodes are connected to a clock voltage source 15, which supplies instead of two-level clock voltages three-level clock voltages, as is indicated in FIG. 3. The device comprises, as already set out above, a 4-phase CCD, the electrodes 8, 9 and 10 or 7, 8 and 10 being used as integration gates and the gate 7 to 9 being used as blocking gates. In FIG. 3, the four clock voltages $\phi_1$–$\phi_4$ are shown as a function of the time t. In the time interval indicated by $T_t$, a pattern of charge packets formed in the device is transported to a read-out member in a usual 4-phase manner. The clocks vary, as usual, between two levels, for example between 0 V and 10 V. In the time intervals indicated by $T_i$ (integration period), trapped radiation images are converted into charge packets. In the period $T_{i,1}$, the electrodes 7 constitute the blocking gates, to which a low voltage is applied, while the remaining electrodes 8, 9 and 10 constitute the integration gates, to which a positive voltage is applied. The blocking voltage ($\phi_1$) applied to the electrodes 7 during the integration period is now lower than the lower level (0 V) of the clock voltage $\phi_1$ during the charge transport and hence also lower than the blocking level applied in conventional devices and indicated in FIG. 3 by a broken line. A specific value of this voltage is, for example, −3 V with an exposure of 1000 times. Due to this additional negative voltage at the blocking gates during the integration period, it is achieved that the extent of overexposure can be increased without the maximum level of a charge packet (=white level) being reduced and without the dissipation being substantially increased. For explanation of the effect of the use of a three-level voltage $\phi_1$, in the same manner as in FIG. 4 the potential diagram is shown again. The substrate voltage is now kept at a fixed value, for example +16 V. The curves 20 and 22 correspond to the curves 20 and 22, respectively, in FIG. 4; in FIG. 5 the curve 20 representing the potential distribution below the blocking gate only during the charge transport and the curve 22 indicating the potential distribution below a storage electrode with a maximum charge content during the charge transport. The curve 25 indicates the potential distribution below an integrating gate in the absence of charge. The curve 26 indicates the potential below the blocking gates 7 during the integration period. Due to the additional negative voltage of −3 V, the curve 26 lies higher than the curve 20. The potential minimum of the curve 26 in the n-type layer is indicated by F. With a strong overexposure, for example of more than 1000 times, the potential level C of the neutral region can increase to such an extent that the overflow barrier $\Delta V_{AB}$ in the p-type layer to the substrate becomes approximately 0.2 V or smaller. The difference between $V_F$ and $V_C$ now remains larger than or at least equal to 1 V due to the additional negative voltage at the blocking gate, as a result of which a satisfactory separation between adjacent pixels is also obtained with a strong overexposure. At the end of the integration period $T_{i,1}$ (FIG. 3), first $\phi_2$ becomes low, after which $\phi_1$ passes to the active positive level. The high potential barriers below the electrodes 7 are replaced by the lower potential barriers below the electrodes 8 corresponding to the potential distribution according to the curve 20 in FIG. 5. Due to the fact that the voltage difference (VA-VC) can now be smaller than 1 V, it is possible that some charge flows from a full pixel to an adjacent pixel over the too low barrier VA. Due to the high clock frequency during the charge transport, the quantity of this charge will generally be negligibly small, however. When the supply of radiation is terminated, for example by means of a shutter, or, which amounts to the same thing for the effects described here, when the charge packet is transported to an area which is not overexposed, the level VC will decrease again due to diffusion to the substrate until the level of the charge packet in the $n_1$ layer has fallen to such an extent that the potential barrier $\Delta V_{AB}$ in the p-layer 3 is again about 0.6 V. This state corresponding to the curve 22 in FIG. 5 is independent of the value of the voltage at the blocking gate and hence of the permissible extent of overexposure. Due to the fact that during the charge transport the clock voltage $\phi_1$ (cf. FIG. 3) varies between the usual high and low levels, the dissipation has substantially not increased.

At the end of the transport period $T_t$, the whole charge pattern has been transferred to the storage section in the case of an FT sensor. In the next integration period $T_{i,2}\phi_1$ can be made again additionally negative, as a result of which the same situation as in the period $T_{i,1}$ is obtained.

However, the pixels are preferably shifted with respect to the preceding integration period through a distance of half a pitch. An additional negative voltage $\phi_3$ is applied to the electrodes 9, which now serve as blocking gates, as a result of which a potential distribution according to the curve 26 in FIG. 5 is induced below these electrodes. A positive voltage is applied to the electrodes 7, like to the adjacent electrodes 10 and 8, as a result of which below each group of three electrodes 7, 8 and 10 a potential well is induced, in which a charge packet can be formed. These packets are effectively separated from each other by the comparatively high potential barriers below the electrodes 9. At the end of the integration period $T_{i,2}$, the charge packets can be transported again in the manner described above. The two patterns recorded in the periods $T_{i,1}$ and $T_{i,2}$ are interlined with respect to each other and thus yield twice the number of pixel elements per unit length in the transport direction as that of a single charge pattern, as a result of which the resolution is considerably increased.

It will be appreciated that the invention is not limited to the embodiment described here, but that many further variations are possible for those skilled in the art without departing from the scope of the invention.

For example, the image sensor arrangement may be of the line transfer type instead of the frame transfer type. Further, the arrangement may constitute a unidimensional sensor or line sensor.

What is claimed is:

1. A charge-coupled device for converting electromagnetic radiation into discrete electrical charge packets and transporting these charge packets in order to read them out, comprising a semiconductor body having at least three successive layers from a surface in a direction transverse to the surface: a first layer of a first conductivity type constituting the charge transport channel of the charge-coupled device; an adjoining second layer of the second conductivity type for forming a potential barrier, over which excess charge carriers generated with local over-exposure can flow in a direction transverse to the surface; and an adjoining third layer of the first conductivity type for draining said excess charge carriers, the surface being provided with a system of electrodes connected to means for supplying clock voltages varying between active and blocking voltage levels, so as to cause potential wells and potential barriers, respectively, to be induced in the subjacent transport channel during operation, characterized in that during the conversion of the electro-magnetic radiation the blocking level differs from the blocking level during the transport of the charge packets in such a manner that during the conversion of the electromagnetic radiation the difference between the active level and the blocking level is greater than during the transport of the charge packets.

2. A charge-coupled device as claimed in claim 1, characterized in that the device comprises a bidimensional image converter of the frame transfer type.

3. A charge-coupled device as claimed in claim 1 or 2, characterized in that in two successive periods, in which the incident radiation is converted into discrete charge packets, the blocking level is applied to different electrodes, as a result of which the photosensitive elements are shifted with respect to each other in these periods.

4. A charge-coupled device as claimed in claim 1 or 2, characterized in that the blocking level during the conversion of the incident radiation is chosen so that with an overexposure of about 1000 a potential barrier of at least about 1 V is present between adjacent charge packets.

5. A camera comprising a charge-coupled device as claimed in claim 1 or 2.

* * * * *